HARMONIC CRYSTAL OSCILLATOR

Filed Nov. 10, 1949 4 Sheets-Sheet 1

INVENTOR
B. H. SIMONS
BY W. J. O'Neill
ATTORNEY

INVENTOR
B. H. SIMONS
BY W. J. O'Neill
ATTORNEY

Nov. 20, 1951 B. H. SIMONS 2,575,363

HARMONIC CRYSTAL OSCILLATOR

Filed Nov. 10, 1949 4 Sheets-Sheet 3

INVENTOR
B. H. SIMONS
BY W. J. O'Neill
ATTORNEY

Nov. 20, 1951

B. H. SIMONS 2,575,363

HARMONIC CRYSTAL OSCILLATOR

Filed Nov. 10, 1949

4 Sheets-Sheet 4

INVENTOR
B. H. SIMONS
BY W. J. O'Neill
ATTORNEY

Patented Nov. 20, 1951 2,575,363

UNITED STATES PATENT OFFICE 2,575,363

HARMONIC CRYSTAL OSCILLATOR

Burton H. Simons, Morristown, N. J., assignor to Bell Telephone Laboratories, Incorporated, New York, N. Y., a corporation of New York Application November 10, 1949, Serial No. 126,510

17 Claims. (Cl. 250—36)

This invention relates to crystal-controlled oscillation generators, and particularly to harmonic mode crystal oscillators which may be utilized for producing radia frequency currents controlled by a mechanical harmonic or overtone mode frequency of one or more associated piezoelectric crystal bodies working in a frequency spectrum which may be of the order of up to 50 megacycles or more per second.

One of the objects of this invention is to provide a harmonic crystal oscillator capable of producing oscillations at a mechanical harmonic mode frequency of one or more associated piezoelectric crystal bodies, without interference from the fundamental or lower mode frequency of such crystal body or bodies.

Another object of this invention is to improve the frequency stability of harmonic crystal oscillators.

Another object of this invention is to provide low current drain on the power supply source for harmonic crystal oscillators.

Another object of this invention is to reduce parasitic oscillations in harmonic crystal oscillators.

Another object of this invention is to reduce the number of circuit components in oscillators operating at the different mechanical harmonic mode frequencies of a plurality of piezoelectric crystal elements.

A particular object of this invention is to provide means for preventing the associated piezoelectric crystal body or bodies from oscillating at its undesired fundamental mode frequency and at the same time permitting it to oscillate at its desired frequency or frequencies, such as the third, fifth or other mechanical harmonic mode frequency thereof.

Another particular object of this invention is to provide a harmonic crystal oscillator circuit capable of operation over a selected range of harmonic mode frequencies corresponding to the several harmonic mode frequencies of a series or plurality of different frequency harmonic mode piezoelectric crystal bodies.

In oscillatory piezoelectric crystal elements of the relatively high frequency type, it has been difficult heretofore to utilize in practical systems the higher order mechanical harmonics of crystal elements. In accordance with this invention, such mechanical harmonics of crystal elements may be made use of, and circuits provided which enable the crystal elements to oscillate efficiently at comparatively high frequencies which may be values up to the order of 50 or more megacycles per second.

For precision control of the frequency of an oscillation generator, it is desirable to utilize a piezoelectric crystal body because of its inherently high frequency stability, and where the frequency desired is higher than that which may be obtained conveniently from the fundamental or lower natural frequency mode of vibration of the piezoelectric body, one or more of the mechanical harmonic or overtone mode frequencies thereof, which have a higher frequency than the fundamental mode frequency, may be individually utilized for accurate frequency control purposes in a suitable circuit.

A piezoelectric crystal body, such as a known thin AT-cut or BT-cut quartz crystal plate or disc adapted to operate in thickness mode vibrations of the shear type, will exhibit mechanical, and also electrical, resonance at harmonics of its fundamental thickness mode frequency, and accordingly may be excited at any selected one of its mechanical harmonic mode frequencies by means of a suitable circuit; and in the case of the AT-cut or BT-cut quartz crystal plate referred to, the harmonic mode frequency may be nearly an exact third, fifth, seventh or other odd order overtone multiple of the fundamental mode frequency thereof and thereby provide a stable harmonic crystal body oscillating at its mechanical harmonic mode frequency for direct and accurate working frequency control purposes at a comparatively high crystal vibration frequency which may conveniently be a value up to 50 megacycles per second, or a considerably higher value.

It will be understood that the harmonic mode vibration of the crystal element itself, rather than the fundamental mode vibration thereof, is of particular interest here in order to obtain directly a high frequency crystal control of the associated circuit frequency. For this purpose, the mechanical harmonic of the crystal element may be an odd order harmonic of the fundamental shear mode thickness vibration in an AT-cut or BT-cut quartz crystal element, for example. Accordingly, with such a suitable type of harmonic crystal unit or units, the circuits provided in accordance with this invention make available an upwardly extended frequency range of reliable crystal-controlled operation.

In accordance with this invention, a harmonic crystal oscillator circuit is provided which may be controlled in frequency by the harmonic mode frequency of the associated harmonic crystal body, or of a plurality of such crystal bodies working at points spaced at intervals over a range of harmonic mode frequencies; and in accordance with a feature of this invention, a frequency discriminator means may be employed in connection with the associated circuit to discriminate against the undesired fundamental mode frequency of the harmonic crystal body or bodies, and at the same time permit the circuit to oscillate only on the desired harmonic mode frequency of the crystal body or bodies.

The oscillator circuit may include a single electronic vacuum tube such as a grounded cathode pentode designed for high frequency use, and having the usual cathode, control grid, screen grid, suppressor grid and anode or plate electrodes, and provided with the usual power supply sources for heating the cathode heater and for supplying suitable positive potentials to the screen grid and plate electrodes of the oscillator tube. Associated with the cathode, control grid and plate electrodes, which may be the oscillating generator electrodes of the oscillator tube, a bridge circuit network or may be provided which may comprise in an arm thereof a suitable piezoelectric harmonic crystal unit connected in the feedback path circuit between the plate and control grid electrodes of the oscillator tube.

In a particular embodiment, the harmonic crystal oscillator circuit provided in accordance with this invention may comprise a grounded cathode single oscillator tube of the pentode type acting as a source of high gain, a frequency-determining bridge system which may be connected in circuit relation with the plate, control grid and grounded cathode oscillator electrodes of the pentode type oscillator tube and which may comprise a frequency-controlling harmonic crystal body disposed in one arm of the bridge and operating at its series resonance harmonic mode frequency in the plate-to-control grid feedback path of the oscillator tube, a neutralizing or balancing condenser which may be disposed in another bridge arm and connected in the control grid-to-plate circuit of the oscillator tube for neutralizing or balancing out the stray shunt capacitance associated with the piezoelectric crystal unit, and condensers, inductors, or resistors respectively disposed in the two remaining bridge arms and having a tap connection therebetween connected with the grounded cathode electrode of the oscillator tube, a tunable circuit tuned with respect to the harmonic mode frequency of the crystal body, and suitable discriminator means associated with the oscillator feedback path for effectively attenuating the undesired fundamental mode frequency of the crystal body or bodies while simultaneously transmitting the desired harmonic mode frequency thereof, and if desired a suitable tuned output circuit for taking off from the crystal oscillator circuit any desired electrical harmonic of the mechanical harmonic mode frequency of the crystal body or bodies.

In a harmonic crystal oscillator, as for example when it is to be used in mobile or other isolated applications, there may be a need for a low current drain on the power supply source used therewith. This objective may be attained by utilizing a single vacuum tube for the source of gain.

Another point of interest is that the neutralizing or balancing condenser, which may be disposed in one of the bridge arms and connected in circuit between the control grid and plate electrodes of the associated oscillator tube, may be utilized to prevent the circuit from oscillating at parasitic frequencies, and hence to permit oscillations at the desired harmonic mode series-resonant frequency of the piezoelectric crystal body.

The impedance of the tank circuit utilized in the plate circuit of the oscillator tube may be kept high, and the impedance in the grid circuit thereof may be kept low, resulting in a maximum strength of oscillation and a decreased effect of the oscillator tube upon the circuit oscillation frequency. Moreover, in circuits as here utilized, since the capacity of the crystal unit as measured from ground to the control grid side of the oscillator tube does not act to prevent the circuit from oscillating because of degenerative feedback, any suitable harmonic crystal may be utilized that has a reasonably low shunt capacity across the crystal itself.

Another point of advantage is that, if the tube used is of the pentode type, an increase in the gain and an increase in the plate resistance for the oscillator tube, and also a decrease in the control grid-to-plate capacity thereof and hence a decrease in effect upon the oscillator circuit frequency results.

In order to prevent oscillation of the circuit as a grid-plate oscillator at the undesired fundamental mode frequency of the piezoelectric crystal element, means may be provided to present a high series impedance at the undesired fundamental mode frequency of the piezoelectric crystal element thus in effect decoupling the oscillator tube from the circuit at that frequency and thereby preventing circuit oscillations at that fundamental mode frequency, and at the same time, this arrangement is adapted to present a much lower impedance at the desired harmonic mode operating or working frequency of the piezoelectric crystal element thus in effect coupling the oscillator tube to the circuit at that harmonic mode frequency and thereby permitting circuit oscillations at that desired harmonic mode frequency. Such a discriminator or filter type arrangement may be conveniently used when the lowest desired harmonic mode operating frequency is relatively quite close to the highest undesired fundamental mode frequency of the piezoelectric crystal element, and hence may be used in applications where the use of other simple expedients would be unsuitable to provide an adequate margin of frequency discrimination between the desired harmonic and the undesired fundamental mode frequencies. Conversely, means may be provided to present a low shunt impedance at the undesired fundamental mode frequency of the piezoelectric crystal element, thus in effect decoupling the oscillator tube from the circuit at that frequency and thereby preventing circuit oscillations at that fundamental mode frequency, and at the same time, this arrangement is adapted to present a much higher shunt impedance at the desired higher harmonic mode operating or working frequency of the piezoelectric crystal element, thus in effect coupling the oscillator tube to the circuit at that harmonic mode frequency and thereby permitting circuit oscillations at that desired harmonic mode frequency. Also, these circuits may be made to operate over a range of desired harmonic mode frequencies due to use of the discriminator methods referred to for preventing the undesired fundamental mode frequency oscillations.

In order to obtain a wide tuning range, as for example to suit the range of harmonic mode frequencies that may be provided by individually utilizing in the circuit a plurality of separate harmonic mode crystal bodies of different frequencies, the tank circuit of the oscillator may be suitably tuned thereto as by adjustment of the variable inductance element thereof.

Where a plurality of harmonic mode crystals are utilized in order to cover a desired range of frequencies, a suitable selector type of switching arrangement may be utilized for the purpose of selectively switching any one of the several harmonic crystals, one at a time, into or out of the oscillator circuit, in order to provide multi-frequency crystal-controlled channels for the oscillator. The switching arrangement may be of the known turret type, or may be a remotely operated arrangement utilizing suitable relays. The switches and crystals may be placed relatively close to the oscillator tube in order to keep stray shunt capacities in the circuit as low as possible. In an alternative arrangement the switches for the several harmonic mode crystal bodies may comprise germanium rectifier type diodes.

In order to obtain a still higher output frequency than may be conveniently obtained directly from the crystal oscillator circuit producing the frequency corresponding to the harmonic mode frequency of the piezoelectric body, use may be made of the non-linear properties of the oscillator tube to further generate electrical harmonics of the mechanical harmonic mode frequency. Such electrical harmonics may be selected by means of a known double tuned transformer or other harmonic selector arrangement adapted to be tuned to any odd or even order electrical harmonic such as a second or third order overtone of the mechanical harmonic mode frequency output that has been provided by the harmonic crystal oscillator circuit itself. In such an arrangement, a circuit in the output of the oscillator tube is tuned to a frequency $nf$ where $n$ is a value 2, 3, 4, etc., and where $f$ is the operating mechanical harmonic mode series-resonant frequency of the piezoelectric crystal body. The desired electrical harmonic of the crystal harmonic mode frequency may be selected by an output circuit which may be connected in series arrangement between the plate electrode of the oscillator tube and the harmonic mode frequency tank circuit.

For a clearer understanding of the nature of this invention and the additional advantages, features and objects thereof, reference is made to the following description taken in connection with the accompanying drawing, in which like reference characters represent like or similar parts and in which.

Figure 1:
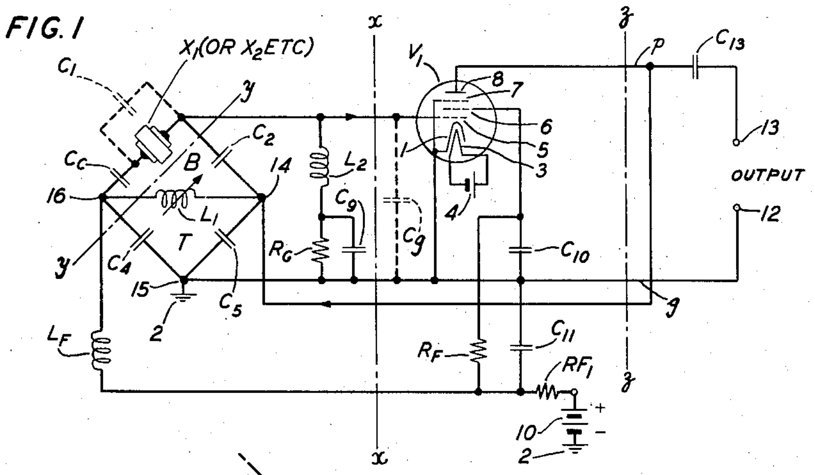
Fig. 1 is a circuit diagram illustrating a bridge type harmonic crystal oscillator utilizing a capacitance tapped bridge configuration associated with a grounded cathode electronic oscillator tube, and an inductance type discriminator means for suppressing oscillations at the undesired fundamental mode frequency of the harmonic crystal body.

Referring to the drawing, Fig. 1 is a circuit diagram illustrating a harmonic crystal oscillator circuit comprising generally an amplifier or source of high gain V1, a bridge network circuit B provided with a tuned tank circuit T comprising capacitors C4 and C5 and a variable inductor L1, and a harmonic mode piezoelectric crystal body X1 or X2, etc., a resonant choke coil L2 adapted for preventing the circuit from oscillating at the undesired fundamental mode frequency of the harmonic mode crystal body X1 or X2, etc., and an output circuit at terminals 12 and 13.

As shown in Fig. 1, the amplifier source of gain V1 may be provided in the form of a single pentode type vacuum tube electronic gain device V1 having a grounded cathode electrode 1 connected to ground 2 and heated by a suitable cathode heater 3 which may be energized by a suitable battery or other power supply source 4, an input or control grid electrode 5 which may be connected through an inductance winding L2 and a suitable grid leak resistor $R_G$ and by-pass condenser C9 with the grounded cathode electrode 1, a screen grid electrode 6 which may be connected through a suitable by-pass condenser C10 to the grounded cathode electrode 1, a suppressor grid electrode 7 which may be connected with the grounded cathode electrode 1, and an anode or plate electrode 8 which, together with the cathode and control grid electrodes 1 and 5, may constitute the oscillation generating electrodes of the vacuum tube V1. As shown in Fig. 1, the anode electrode 8 of the oscillator tube V1 may be energized with a suitable positive potential, through the coil L1, the radio frequency choke coil $L_F$ and a filter resistor $R_{F1}$, by means of a battery or other suitable power supply source 10 having its negative terminal connected to ground 2. Similarly, the screen electrode 6 of the oscillator tube V1 may be energized with a suitable positive potential through filter resistors $R_F$ and $R_{F1}$ connected with the positive terminal (+) of the power supply source 10. Suitable direct-current blocking or by-pass capacitors $C_9$, $C_{10}$, $C_{11}$ and $C_c$ may be provided as shown in Fig. 1.

As illustrated in Fig. 1, the frequency-controlling bridge network system B which is connected in circuit relation with the grounded cathode electrode 1, the control grid electrode 5 and the plate or anode electrode 8 of the vacuum tube V1, may be provided with tank circuit capacitance-dividing capacitors C4 and C5 disposed in two adjacent arms respectively of the bridge B and having a tap connection at 15 therebetween connected with the grounded cathode electrode 1 of the vacuum tube V1. The series-resonant harmonic mode crystal body X1 or X2 or X3, etc., disposed in a third arm of the bridge B, may be connected in the feedback path circuit extending between the control grid and plate electrodes 5 and 8 respectively of the vacuum tube V1, as shown in Fig. 1. In the fourth arm of the bridge B, a neutralizing or balancing capacitor C2 may be provided and connected in circuit between the control grid and plate electrodes 5 and 8 respectively of the vacuum tube V1, in order to neutralize or balance out the stray shunt capacity C1 associated with the crystal body X1, X2 or X3, etc.

The tuned tank circuit T, as illustrated in Fig. 1, may comprise the series-connected capacitors C4 and C5 connected in parallel circuit relation with the variable inductance tuning winding L1, and may be tuned with respect to a desired mechanical harmonic mode series-resonant frequency of one or any of the piezoelectric crystal bodies X1, or X2, or X3, etc. Output circuit oscillations corresponding to the desired crystal harmonic mode frequency may be taken from the circuit at output terminals 12 and 13, the terminal 12 being connected with the grounded cathode electrode 1 of the vacuum tube V1, and the terminal 13 being connected through a suitable coupling condenser C13 to the plate electrode 8 of the electronic gain device V1.

The series-resonant harmonic crystal bodies X1, X2 and X3, etc., may comprise any suitable piezoelectric harmonic mode crystal bodies each adapted to operate and work at a desired mechanical harmonic mode overtone frequency of its fundamental mode frequency. For this purpose, a thickness shear mode AT-cut or BT-cut quartz crystal element, operating and working at an odd order mechanical harmonic of its fundamental thickness mode of motion, may be conveniently utilized, and the desired series-resonant harmonic mode frequency thereof may be the third, fifth, seventh, or other odd order harmonic mode frequency thereof, corresponding to the frequency desired for the crystal oscillator circuit oscillations. Examples of such harmonic AT-cut or BT-cut quartz crystals, with mountings and holders therefor adapted to form a harmonic crystal unit, are disclosed in United States Patents No. 2,218,200 issued October 15, 1940, to Lack, Willard and Fair, and No. 2,453,435 issued November 9, 1948, to H. Havstad; and in applications Serial No. 623,150 filed October 18, 1945, by L. J. La Brie, now Patent No. 2,486,482 dated November 1, 1949, and Serial No. 26,013 filed May 10, 1948, by F. Caroselli, now Patent No. 2,509,478 dated May 30, 1950. While the present invention is described particularly in connection with AT-cut or BT-cut harmonic mode crystals which employ thickness mode vibrations of the shear type, it will be understood that the harmonic crystal bodies X1, X2, and X3, etc., may be any suitable type of harmonic crystal body where the capacity C1 across the crystal itself is preferably of reasonable low value. Since, in this circuit arrangement as shown in the drawing, the capacity of the crystal unit X1, as measured from the control grid side 5 of the circuit to ground 2, does not tend to prevent the circuit from oscillating because of degenerative feedback, the crystal body X1 or X2, etc., may be any suitable harmonic crystal body that has a reasonably low capacity C1 across the crystal body itself.

As illustrated in Fig. 1, the harmonic crystal body X1, X2 or X3, etc., operates at its harmonic series-resonance frequency; and for operation at its series-resonance frequency the harmonic crystal body X1, X2 or X3, etc., is connected in circuit in the feedback path extending between the control grid electrode 5 and the plate electrode 8 of the vacuum tube V1, the circuit being traced as follows: from the control grid electrode 5 of the vacuum tube V1 through the crystal body X1 and the blocking condenser $C_c$ to one end 16 of the tuned tank circuit T, then through the tank circuit T to the other end terminal 14 thereof, and then back to the plate electrode 8 of the vacuum tube V1.

As illustrated in the drawing, a single oscillator tube V1 may be utilized, with a resultant reduction in the magnitude of current drain upon the associated power supply sources 4 and 10, a feature which may be of interest in portable or mobile or other isolated installations, where a low current drain may be desired or required.

Also as illustrated in the drawing, the use of the vacuum tube V1 in the form of a pentode V1 is shown. The use of the pentode V1 results not only in an increase in the gain and in the plate resistance for the vacuum tube V1, but also in a decrease in the value of the grid plate capacity for the tube V1, which is effectively part of the neutralizing capacity C2, so that smaller effective values of neutralizing capacity C2 may be realized. Also, the use of the capacity tap at 15 between capacitors C4 and C5 on the harmonic crystal oscillator tank circuit T reduces the possibility of parasitic oscillations, since the vacuum tube V1 and the stray capacity associated therewith is thereby paralleled with the capacitors C4 and C5 and not with parts of the tank circuit inductance L1. Accordingly, with the use of such a single tube V1 having a grounded cathode electrode 1 connected to a tap 15 between the capacitance-dividing capacitors C4 and C5, there is provided not only a resultant saving in the number of tubes used, but also the magnitude and number of undesired response frequencies may be reduced, and the possibility of obtaining oscillator operation on other than the correct frequency is reduced.

The neutralizing or balancing capacitor C2, which as shown in the drawing, is connected in circuit between the control grid and plate electrodes 5 and 8 respectively of the vacuum tube V1, may be made up in its capacitance value of the grid-to-plate interelectrode capacity of the vacuum tube V1, plus an external capacity such that the bridge B is balanced against the stray capacity C1 that may be associated with the crystal unit X1, or X2, etc. The capacitance value for the neutralizing capacitor C2 may usually be quite small, even when the capacitance-dividing capacitors C4 and C5 are chosen in the optimum ratio with respect to each other. Thus, the impedance of the tank circuit L1, C4, C5 in the plate circuit 8 of the vacuum tube V1, may be kept relatively high and that in the grid circuit 5 thereof may be kept relatively low, thereby resulting in a maximum strength of oscillation and a decreased effect of the tube V1 upon the desired oscillator frequency value.

The tank circuit voltage-dividing capacitors C4 and C5 may be chosen in the optimum ratio for oscillation by methods well known in the art, and the capacitances $C_c$, C1 and C2 may be related thereto in the following manner: The capacitance $C_c$ serves to block the direct-current plate supply voltage from the crystal X1 and is normally large in capacitance compared to the capacities C1 and $C_g$. The capacity C1 is the sum capacitance of the shunt capacity of the crystal X1, its holder, and socket and stray wiring and circuit capacity. The capacitance of C2 is then chosen in value to balance the bridge composed of capacitances C4, C5, C1 and C2, so that no transmission from the plate circuit 8 to the grid circuit 5 occurs because of presence of capacity C1. Thus if capacitances C4 and C5 were in the ratio of 2 to 1, the ratio of capacitances C1 to C2 should be 2 to 1. Transmission from the plate circuit 8 to the grid circuit 5 then can only occur when the crystal impedance, across which the capacity C1 appears, is low compared to that of C1, which condition obtains only when the frequency is at or very close to the series-resonant frequency of the crystal X1, and the circuit then oscillates at this frequency.

In accordance with a feature of this invention, the discriminator coil L2, which in Fig. 1 is added in circuit between the grid electrode 5 of the oscillator tube V1 and the grid end of the grid leak resistor $R_G$, may be utilized to prevent circuit oscillations as a grid-plate oscillator at the undesired fundamental mode frequency of the crystal body X1, X2 or X3, etc., while, at the same time, permitting oscillations as a grid-plate oscillator at the desired harmonic mode series-resonant frequency thereof. For this purpose, the discriminator inductance L2 may be designed to parallel-resonate the total grid-to-ground capacity $C_g$ of the circuit at a frequency which is lower than the lowest desired harmonic mode frequency of the crystal bodies X1, X2, X3, etc., and thereby is made of a suitable impedance value to attenuate or in effect block the undesired lower frequency fundamental mode oscillation and, at the same time, transmit the desired higher frequency harmonic mode oscillations. Accordingly, the discriminator coil L2 may be designed to present a relatively low impedance at the undesired fundamental mode frequency of the crystal body or bodies X1, X2 and X3, and thus effectively decouple the grid of the oscillator tube V1 from the tuning tank circuit L1, C4, C5 at such undesired fundamental mode frequency or frequencies of the crystal bodies X1, X2, X3. But, at the desired operating or working frequency, which is the harmonic mode series-resonant frequency of the harmonic crystal body X1, X2 or X3, the discriminator choke coil L2 is designed to present a much higher impedance and thus effectively couple the oscillator tube V1 to the tuning tank circuit L1, C4, C5 at such desired harmonic mode frequency or frequencies of the crystal bodies X1, X2 or X3.

Accordingly, due to the present method of using the discriminator inductor L2 for preventing fundamental mode oscillations while at the same time permitting harmonic mode oscillations, the circuit shown in the drawing, utilizing a plurality of harmonic crystal bodies X1, X2, X3, etc., for multifrequency channel operation, may be made to operate over a range of working harmonic mode frequencies. The tank circuit T, comprising the parallel-connected inductance winding L1 and capacitors C4 and C5, may be tuned to suit the harmonic mode frequencies within the range of such frequencies; or optionally the tank circuit T may be tuned by adjustment of the variable inductance of the winding L1. Oscillations at the harmonic mode frequency may be taken off from the output circuit by magnetic or capacitive coupling methods well known to the art.

Figures 1A, 1B:
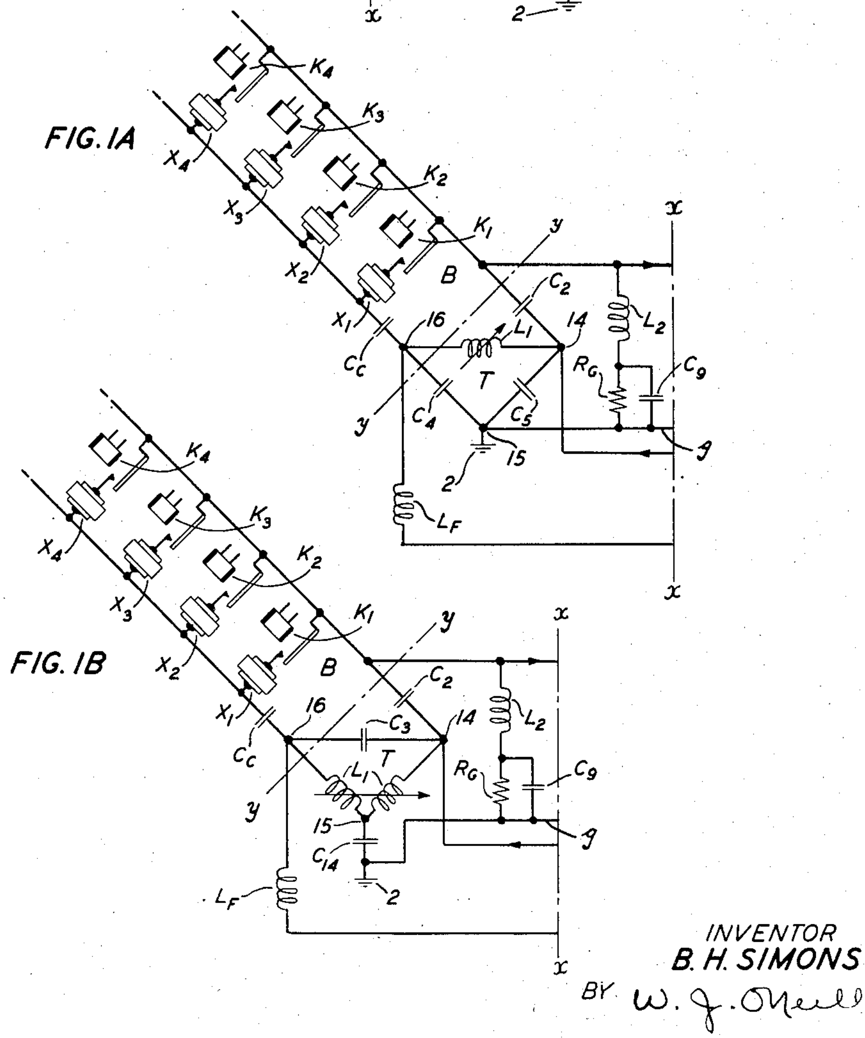
Fig. 1A is a circuit diagram illustrating a series of different frequency harmonic mode crystals as applied to the oscillator circuit of Fig. 1 at the left side of the broken line $y$—$y$.
Fig. 1B is a harmonic crystal oscillator circuit diagram, similar to those shown in Figs. 1 and 1A, but illustrating an inductance tapped bridge configuration, instead of the capacitance tapped bridge configuration as shown in Figs. 1 and 1A.
Figure 1C:
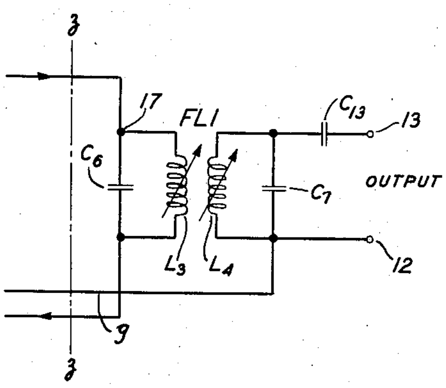
Fig. 1C is a circuit diagram illustrating one means of obtaining electrical harmonics of the harmonic mode frequency from the circuit of Fig. 1 at the right of the line $z$—$z$.

It will be noted that the oscillator apparatus, as shown in Figs. 1 and 1A, is adapted to operate at comparatively high harmonic mode crystal frequencies; and since the oscillator tube V1 operates as a non-linear device, harmonics of the harmonic mode frequency are generated and may be selected by suitable tuned circuits FL1 associated with the oscillator tube V1, as shown in Fig. 1C, wherein the output frequency at the output terminals 12 and 13 may be 2, 3, 4, etc., times that of the working harmonic mode frequency of the crystal body X1, X2, or X3, etc.

The frequency stability of these circuits is comparatively good in respect to frequency shift with changes in the voltage of the battery or power supply 10, with changes of tubes V1, and with changes in the tuning of the tank circuit L1, C4 and C5.

Figure 3:
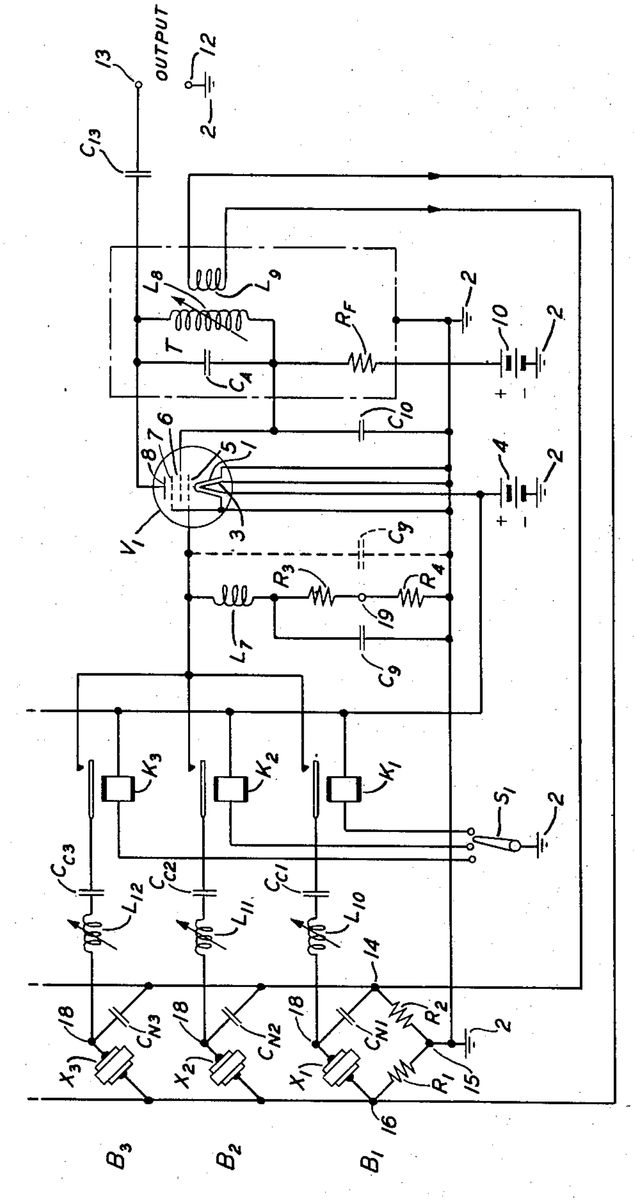
Fig. 3 is a circuit diagram illustrating a modification of harmonic crystal oscillator circuit provided with frequency adjusting means.

Fig. 1A, as already indicated, is a circuit diagram utilizing the same circuit as shown in Fig. 1, but illustrating more particularly, at the left side of the broken line *y—y*, the plurality of separate and different frequency harmonic mode crystals X1, X2, X3, X4, etc., which may be selectively connected, one at a time, into the associated arm of the bridge B, by means of suitable selective relay operated switches K1, K2, K3, K4, etc., respectively, which may be selectively operated by a remote control selector switch S1, as illustrated in Fig. 3 for example, thereby to provide multifrequency crystal-controlled oscillations, in the same oscillator circuit, at any one of a series of desired crystal harmonic mode frequencies spaced at intervals extending over a selected band or range of frequencies.

As an illustrative example in a particular case for a harmonic crystal oscillator circuit, constructed in accordance with Figs. 1 and 1A, and 1C, and utilizing six individual AT-cut harmonic mode crystals X1, X2, X3, etc., operating separately at six different working thickness-mode mechanical (fifth) harmonic frequencies spaced at intervals over the range of frequencies extending about from 43 to 48 megacycles per second, the vacuum tube V1 may be a pentode known as the 6AJ5 or other suitable source of gain, the power supply source 10 may be a battery of about 60 volts direct-current potential or other suitable source of power supply, and the component circuit resistors, condensers and inductance windings thereof may have values approximately as follows: inductance choke coil $L_F$ about 70 microhenries, tank circuit inductance tuning winding L1 from about .48 to .60 microhenry as provided by about seven and one-half turns of No. 20 wire at eighteen turns per inch on a 0.375-inch diameter form tuned with a ¼-inch by ⅜-inch long iron slug, condensers C9, C10, C11 each about 500 micromicrofarads, capacitance C1 across the crystals X1 or X2, etc., about 4 micromicrofarads, neutralizing condenser C2 about 1.0 micromicrofarad, condenser $C_c$ about 100 micromicrofarads, tank circuit condenser C4 about 100 micromicrofarads, tank circuit condenser C5 about 25 micromicrofarads, condensers C6 and C7 in this instance about zero micromicrofarad when these circuits L3, L4 tune with associated tube capacities, grid leak resistor $R_G$ about 270,000 ohms, and filter resistors $R_F$ and $R_{F1}$ each about 1000 ohms. The coils L3 and L4, tunable to three times the frequency of the crystal frequency tank circuit L1, C4 C5, may each comprise about six turns of No. 18 wire at fourteen turns per inch on a 0.350-inch diameter form tuned with a ¼-inch by ⅜-inch long iron slug, and radio frequency choke coil L2 may comprise, in this particular example, about sixteen turns of No. 25 wire close wound on a 0.198-inch by ⅝-inch long iron core with pigtail leads.

Fig. 1B is a diagram of a harmonic crystal oscillator circuit wherein the configuration of the bridge or network B has been modified from the form utilizing the tapped bridge arm capacitors C4 and C5 as shown at 15 in Figs. 1 and 1A, to the form utilizing a tapped coil L1 as shown at 15 in Fig. 1B, the point 15 being by-passed to ground 2 by a condenser C14 and the position of the grounded tap at 15 on the bridge B, and other connections to the bridge B, being otherwise the same as illustrated in Figs. 1 and 1A. Accordingly, as shown in Fig. 1B, the two bridge arm capacitors C4 and C5 of Figs. 1 and 1A have been removed and the tapped coil L1 substituted therefor, and a capacitor C3 has been inserted between points 14 and 16 in the place of the coil L1 in Figs. 1 and 1A, the tank circuit T of Fig. 1B thereby comprising the capacitor C3 shunted by the variable inductance coil L1 tapped at 15 and connected with the grounded cathode electrode 1 of the oscillator tube V1 through the by-pass condenser C14.

As compared with the tapped inductance form of bridge circuit B illustrated in Fig. 1B, the tapped capacitance form of bridge B illustrated in Figs. 1 and 1A results in somewhat more freedom from parasitic oscillations and also in lower losses in the tuned tank circuit T, because of somewhat less circulating current in the ground path thereof at 15. The capacitance tapped bridge B shown in Figs. 1 and 1A has however a somewhat greater tendency to oscillate at the undesired fundamental mode frequency of the associated crystal body X1, X2 or X3, etc., and in order to block such oscillations at that undesired fundamental mode crystal frequency referred to, the gain at that frequency, around the feedback loop circuit, may be reduced at that fundamental mode frequency to less than unity by suitable means such as by tapping the plate electrode 8 down on the tuned circuit T by inserting a small capacitance (not shown) between the plate electrode 8 and the top of the tuned circuit at 14, the shunt feed choke $L_F$ then being disconnected from 16 and instead connected to the electrode 8 of the tube V1; or by shunting the grid 5 to ground 2 by means of the discriminator inductance winding L2, the inductance value of the winding L2 being chosen to present a low value of reactance at the undesired fundamental mode crystal frequency while still presenting a high impedance to the desired harmonic mode crystal frequency or frequencies. For this purpose the value selected for the inductance winding L2 may be such as to just parallel-resonate the total circuit grid-to-ground capacity $C_g$ at a frequency slightly below the lowest harmonic mode crystal frequency to be used, and such a selection insures that the sign of the reactance from the grid 5 to the ground 2 over the desired harmonic mode crystal frequency band may remain the same and thus prevent the possibility of other or spurious oscillations.

While the discriminator inductor L2 may be utilized in combination with the capacitance tapped bridge B shown in Figs. 1 and 1A, or with the inductance tapped bridge B shown in Fig. 1B, its use in connection with the latter form shown in Fig. 1B may be dispensed with in cases where the plate 8 to cathode 1 impedance at the undesired fundamental mode crystal frequency, is sufficiently low.

Figure 2:
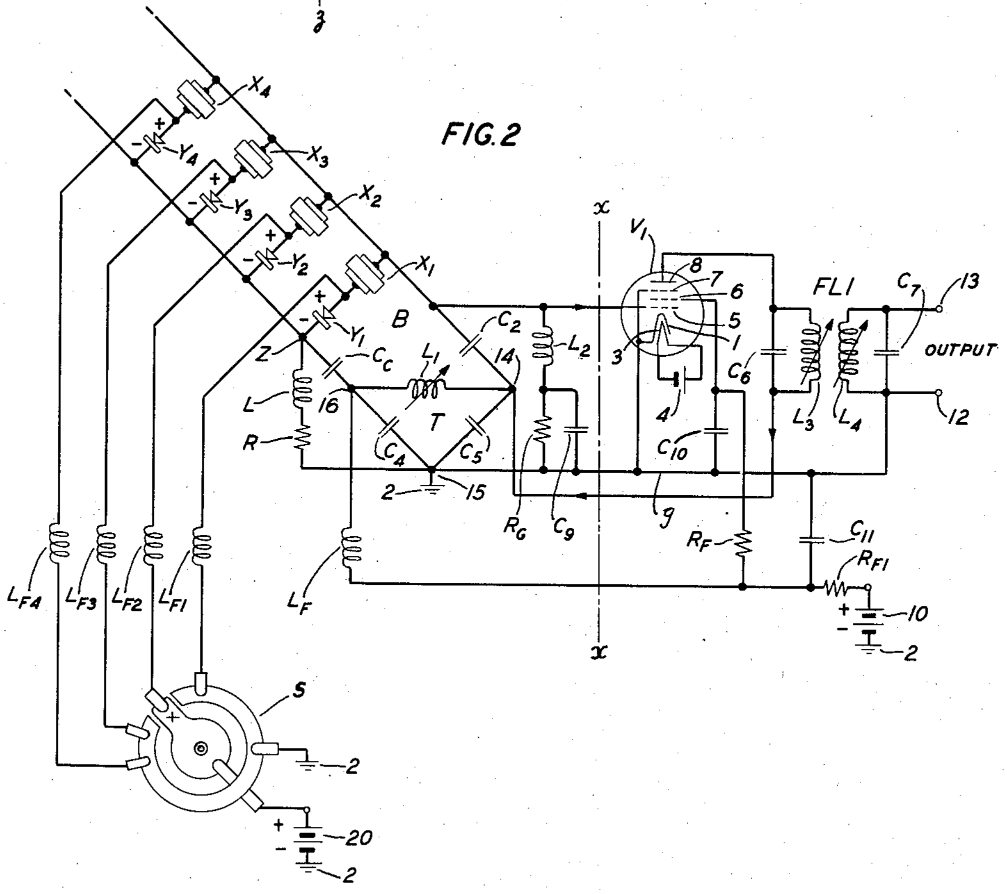
Fig. 2 is a circuit diagram illustrating a modification of the harmonic crystal oscillator circuits shown in Figs. 1 and 1A, as provided with rectifier type crystal switching means.

Fig. 2 is a diagram illustrating a harmonic crystal oscillator circuit, similar to that shown in Figs. 1 and 1A provided with one form of remote switching means, but provided in Fig. 2 with a modification in the form of the remote switching means wherein the crystal selector switching means may comprise rectifiers Y1, Y2, Y3, Y4, etc. adapted to permit the remote selection of any of the several mechanical harmonic mode series-resonant frequencies contained in a desired frequency band as provided by the several harmonic mode crystal bodies X1, X2, X3, X4, etc. As an illustrative example, the desired frequency band may be a band such as an 0.5 per cent frequency band with a spacing between the frequencies thereof of about 0.07 per cent.

As illustrated in Fig. 2, the circuit may employ a bridge or network B having selectively disposed in one arm thereof a plurality of harmonic mode crystal bodies X1, X2, X3, X4, etc., and a plurality of associated rectifiers Y1, Y2, Y3, Y4, etc. respectively, provided with suitable switching equipment for selectively and operatively disposing any of the harmonic mode crystal bodies X1, X2, X3 or X4, one at a time, into the bridge B. The bridge B in Fig. 2 may, like the bridge B in Figs. 1 and 1A, be connected with the grounded cathode oscillator tube V1, and the circuit of Fig. 2 may, similar to that in Figs. 1 and 1A, provide harmonic mode crystal-controlled oscillations with suppression of the undesired fundamental mode crystal frequencies by means of the discriminator inductance winding L2, or by other suitable means. Like reference characters in Fig. 2 represent like or similar parts in Figs. 1 and 1A, the additional parts in Fig. 2 comprising a series-connected inductance winding L and resistor R associated with the bridge system B, a plurality of rectifiers Y1, Y2, Y3, Y4, etc., and respective radio frequency choke coils $L_{F1}$, $L_{F2}$, $L_{F3}$, $L_{F4}$, etc., associated with the crystal selector switching device S. The rectifiers Y1, Y2, etc., may be, for example, any suitable type of "germanium" crystal diodes. The winding L may also be a radio frequency choke coil. These choke coils are selected to present negligible shunting effect upon the portion of the tuned circuit T across which they are connected. The resistor R may be any suitable resistor having a resistance value selected to limit the direct current through the crystal diodes Y1, Y2, etc. to their rated value, and the switch S may be a suitable crystal selector switch which selectively applies positive (+) voltage from a suitable power supply source 20 through a suitable choke coil $L_{F1}$, $L_{F2}$, $L_{F3}$ or $L_{F4}$, etc., respectively to the particular crystal diode Y1, Y2, etc., associated with the then working respective harmonic crystal body X1 or X2, etc., of the desired harmonic mode frequency, and which at the same time grounds all other crystal diodes Y1, Y2, etc., associated with the remaining harmonic mode crystal bodies not then operating.

When the crystal selector switch S supplies a positive (+) voltage to a particular crystal diode Y1 or Y2, etc., that diode then becomes electrically conductive and will have an internal forward resistance which may be of the order of approximately 75 ohms, or other suitable resistance value, which is low enough to permit the circuit to oscillate at the harmonic mode frequency of the particular harmonic crystal body X1 or X2, etc., associated with the then working crystal diode Y1 or Y2, etc. At the same time, since the point Z in the circuit is positive with respect to ground 2 and the selector switch S applies a ground connection to the remaining crystal diodes, the latter are not then electrically conductive since they then have a high reverse impedance with the result that the circuit will not then oscillate at the frequency of any of the other remaining harmonic crystal bodies. Thus, as an example as illustrated in Fig. 2, the selector switch S when disposed in the position particularly shown therein applies a positive (+) direct-current potential from the power supply source 20 to the diode Y2 only, thereby permitting the associated piezoelectric harmonic crystal body X2 to oscillate; at the same time, the selector switch S connects to ground 2 all of the remaining diodes Y1, Y3, and Y4, etc., thereby preventing the associated piezoelectric harmonic crystal bodies X1, X3, and X4, etc., from oscillating.

It will be understood that the capacitance value of the neutralizing or balancing capacitor C2 of Fig. 2 may be increased somewhat over that shown for use in the circuits of Figs. 1 and 1A, in order to neutralize the increased capacity as provided in Fig. 2 by the additional diodes Y1, Y2, etc. that are utilized in Fig. 2.

Fig. 3 is a diagram illustrating a bridge or network type harmonic crystal oscillator circuit, provided with a small amount of circuit frequency shift or adjustment individually for each of the plurality harmonic mode crystal bodies X1, X2, X3, etc., which are adapted to operate separately at their respective different harmonic mode frequencies spaced at intervals extending over a selected range or band of frequencies.

The small amount of adjustable shift in the crystal oscillator frequency may be obtained, as illustrated in Fig. 3, by means of a tuned circuit comprising the inductances L10, L11, L12, etc., cooperating with the effective associated oscillator grid 5-to-ground 2 capacity $C_g$ in series with the respective coupling capacities $C_{c1}$, $C_{c2}$, $C_{c3}$, etc. The respective inductances L10, L11, L12, etc., are connected in series relation with the respective harmonic mode crystals X1, X2, X3, etc., and are disposed in the feedback path circuit extending between the control grid electrode 5 and the plate electrode 8 of the oscillator tube V1. Since the use of this tuned circuit (L10, $C_{c1}$, $C_g$; L11, $C_{c2}$, $C_g$; L12, $C_{c3}$ $C_g$, etc.) arrangement results in a substantially 90-degree phase shift in the oscillator feedback loop circuit, the additional 90-degree phase shift required in the feedback path for oscillation at the bridge terminals 14 and 16, may be obtained by means of an inductance device L9 having a high leakage inductance and adapted for coupling the bridge B to the plate circuit 8 of the oscillator tube V1. The inductive coupling as provided by the inductance windings L8 and L9 and the low value of resistance as provided by the bridge arm resistors R1 and R2 of the bridge B may be made of values to make the gain of the oscillator feedback path too low for oscillation at the undesired fundamental mode frequency of the harmonic crystal body X1 or X2, etc., and hence the use of the inductance winding L7 is not necessarily required here, in most cases, to stop oscillations at the undesired fundamental mode crystal frequency but may however be used for that purpose if desired, as well as for the purpose of raising the effective capacitive reactance at the input grid circuit 5 of the oscillator tube V1 so that an increased range of frequency adjustment is provided by the associated series inductance tuning.

As illustrated in Fig. 3, the plurality of series-resonant harmonic mode crystal bodies X1, X2, X3, etc. associated with their respective bridges B1, B2, B3, etc., may be individually connected in the feedback circuit extending between the control grid and plate electrodes 5 and 8 respectively of the pentode type oscillator tube V1 by means of the respective crystal selecting relay operated switches K1, K2, K3, etc., controlled by a suitable crystal relay selector switch S1.

For the purpose of independently adjusting the circuit frequency associated with each of the harmonic mode crystal bodies X1, X2, X3, etc., the frequency-adjusting variable inductance devices L10, L11, L12, etc., may each be connected in series circuit relation with the respective harmonic mode crystal bodies X1, X2, X3, etc., and may each be varied in inductance value, as for example some ±30 per cent, by means of a known powdered iron slug inductance control device. Connected in series circuit relation with the respective frequency-adjusting inductances L10, L11, L12, etc., there may be provided condensers $C_{c1}$, $C_{c2}$, $C_{c3}$, etc., respectively, which may each have a capacitance value of the order of 5 micromicrofarads or other suitable value adapted to raise the inductance-capacitance ratio of the frequency-adjusting circuit L10, $C_{c1}$, etc., to a value such that the inductance adjustment of the respective inductors L10, L11, L12, etc., may shift the circuit frequency a greater amount.

As illustrated in Fig. 3, the respective bridges B1, B2, B3, etc., may each comprise four arms, the two lower arms of which may comprise the common resistors R1 and R2 having a tap connection 15 therebetween connected with the grounded cathode electrode 1 of the oscillator tube V1. The resistors R1 and R2 may be made of suitable resistance values to develop thereacross at terminals 14 and 16, the grid driving and neutralizing voltages for the circuit. It will be noted that in the circuit of Fig. 3, the bridge arm resistors R1 and R2 are utilized, in place of the bridge arm capacitors C4 and C5 shown in Figs. 1, 1A and 2.

As illustrated in Fig. 3, neutralizing or balancing capacitors $C_{N1}$, $C_{N2}$, $C_{N3}$, etc., similar to the neutralizing capacitor C2 shown in Figs. 1 and 2, may be associated with the corresponding arms of the respective bridges B1, B2, B3, etc., and may be utilized to prevent the circuit from oscillating at other than the desired series-resonant frequency of the respective circuits associated therewith, by neutralizing or balancing out the stray shunt capacity C1 associated with the respective harmonic crystal units X1, X2, X3, etc.

The inductance coil L7, corresponding to the discriminator inductance coil bearing the reference character L2 in Figs. 1, 1A, 1B and 2, may be similarly utilized to parallel-resonate the input circuit capacity of the tube V1 and also the capacity of the associated relays K1, K2, K3, etc., at a frequency which is somewhat below the lowest harmonic mode frequency of the series of harmonic crystal bodies X1, X2, X3, etc., thereby to reduce the effective grid capacity at the harmonic mode frequencies of the crystal bodies X1, X2, X3, etc., and to suppress oscillations at the undesired fundamental mode frequencies thereof. Alternatively, the inductance winding L7 may be utilized in the circuit shown in Fig. 3 merely to raise the impedance of the input grid circuit 5 of the oscillator tube V1 so that the inductance-capacitance ratio of the associated frequency adjusting circuits may be increased and a greater frequency shift obtained by adjustment of L10, L11, etc., while relying upon the inductive coupling of windings L8 and L9 and the low resistance values of resistors R1 and R2 to stop oscillations at the undesired fundamental mode frequencies of the crystal bodies X1, X2 and X3, etc.

As an illustrative example, the harmonic crystal bodies X1, X2, X3, etc., may in Fig. 3 comprise six or other number of different frequency harmonic mode series-resonant type crystal bodies, and may be operated without the use of a constant temperature-controlled heating oven with a considerable saving in current drain on the associated power supply source, a factor which may be of interest in connection with use in vehicular or other mobile or isolated radio equipment. Where the harmonic crystal bodies X1, X2, X3, etc., have a good frequency stability, as of the order of ±.005 per cent, they may be utilized without the heating oven, and the circuit illustrated in Fig. 3 may provide a frequency adjustment of the order of ±.0015 per cent thereby eliminating the usual crystal grinding tolerance.

As an illustrative example in a particular case, a harmonic crystal oscillator circuit constructed in accordance with the circuit shown in Fig. 3 and providing a frequency adjustment of about ±.0015 per cent utilizing six harmonic mode crystal bodies X1, X2, X3, etc., having a frequency stability of the order of ±.005 per cent and giving six crystal-controlled mechanical harmonic mode frequencies within a 220-kilocycle per second frequency band in a range of harmonic mode crystal frequencies from about 43.8 to 47.2 megacycles per second, may have the following circuit components: the harmonic crystal bodies X1, X2, X3, etc., may be six separate AT-cut harmonic mode quartz crystal piezoelectric elements having mechanical harmonic mode frequencies of about 43.80, 43.82, 43.86, 43.90, 43.94 and 44.02 megacycles per second, respectively. The six corresponding frequency-adjusting inductances L10, L11, L12, etc., may each have an inductance value of about 6.5 microhenries and may be varied in inductance value approximately ±30 per cent by means of a known powdered iron slug. The six corresponding series condensers $C_{c1}$, $C_{c2}$, $C_{c3}$, etc., may each have a capacitance value of about 5 micromicrofarads, in order to raise the inductance-capacitance (L/C) ratio of each associated frequency-adjusting circuit so that the ±30 per cent inductance adjustment in the six corresponding inductance devices L10, L11, L12, etc., may be adequate to shift the associated circuit frequency the desired amount. The six corresponding bridge arm neutralizing condensers $C_{N1}$, $C_{N2}$, $C_{N3}$, etc., may each have a capacitance value of about 6 micromicrofarads or other value suitable for neutralizing the shunt capacity C1 of the respective crystals and their sockets associated with the six corresponding harmonic crystal units X1, X2, X3, etc., thereby to prevent the circuit from oscillating at other than the desired series-resonant crystal frequencies thereof. The bridge arm resistors R1 and R2 may be about 10-ohm carbon resistors. The six corresponding crystal selecting relay switches K1, K2, K3, etc., may be any suitable devices. The coil L7 may have an inductance value of about 1.5 microhenries or other value designed to parallel-resonate the vacuum tube V1 input capacity and the relay L1, etc., capacity totaling about 16 micromicrofarads, at a frequency somewhat below the lowest crystal harmonic mode frequency of about 43.8 megacycles per second in this example, so that the effective grid capacity may be reduced to approximately 5 micromicrofarads at the crystal working frequencies. The by-pass condensers C9 and C10 may each comprise 500-micromicrofarad known button-type by-pass condensers. The grid resistor $R_G$ may comprise a grid leak resistor R3 of about 270,000 ohms, and a resistor R4 of about 10,000 ohms, providing a metering point at 19 for grid current measurement. The oscillator tube V1 may be a pentode known as a 403B vacuum tube, or other suitable electronic gain device, energized by a voltage of about 120 volts from the power supply source 10 supplied through a plate and screen filter resistor $R_F$ of about 1000 ohms. The plate tank tuning capacitor $C_A$ may have a capacitance value of about 20 micromicrofarads, and the plate tank tuning inductance L8 may have an inductance value of about 0.50 microhenry. The grid circuit coupling coil L9 may have an inductance value of about 0.80 microhenry or other value suitable for providing a substantially 90-degree phase shift in that part of the feedback path coupling the tank circuit T to the input of the bridges B1, B2, B3, etc.

The plate tank circuit T at $C_A$, L8 may be turned to resonance at the mean frequency of the several harmonic crystal bodies which are six in number as utilized in the foregoing example. Since, in that example, the maximum spread in crystal frequency is about 220 kilocycles per second, the plate tank circuit $C_A$, L8 will be tuned to resonance within about ±.25 per cent for any crystal frequency, and is therefore predominately resistive. The grid coupling coil L9 has a leakage reactance of approximately ten times the terminating resistance of resistor R1 plus resistor R2, and is coupled to the plate tank tuning inductance L8, and when it is so terminated in the bridge resistors R1 and R2, the Q of the plate tank circuit tuning inductance L8 is reduced to approximately 50 per cent of its value when not so terminated. Accordingly, because the leakage reactance of the grid circuit coupling coil L9 is made relatively high as compared to the resistance of resistor R1 plus resistor R2, the voltages developed across the series resistors R1 plus R2 are essentially at 90 degrees phase relation with respect to the voltage across the plate tank circuit tuning inductance L8. The relatively low values of resistances employed for the terminating bridge resistors R1 and R2 insure that this 90-degree phase shift may be obtained even though the capacity across the coupling coil L9 as provided by the crystal bodies X1, X2, X3, etc., and also by the neutralizing condensers $C_{N1}$, $C_{N2}$, $C_{N3}$, etc., may be high.

The frequency-adjusting variable inductance coils L10, L11, L12, etc., tune the various grid circuits respectively associated therewith to series resonance and present a resistive load to the respective crystal bodies X1, X2, X3, etc., which also operate at series resonance. Since the voltage on the grid electrode 5 of the oscillator tube V1 is developed across the effective grid capacity $C_g$, a further 90-degree phase shift occurs therein, and accordingly the oscillator feedback loop circuit then has a full 180-degree phase shift required for oscillation.

When the frequency-adjusting inductance coil L10, L11, or L12, etc., is adjusted so that the associated external grid circuit operates on either side of the series resonance condition, a varying value of capacity or inductance is then presented to the associated crystal body X1, X2, X3, etc., which then shifts its operating frequency slightly until it supplies the inductance or capacity required for the correct oscillator phase shift and maximum grid voltage for the oscillator tube V1. The amount of such frequency shift that can be obtained in this manner is essentially limited by the crystal body X1, X2, X3, etc. In one direction of operation, namely, as the magnitude of the inductance of the variable inductance device L10, L11 or L12, etc., is increased in inductance value, the associated crystal body X1, X2 or X3, etc., operates at a frequency at which it is in effect a smaller and smaller capacity until it finally becomes comparable to the crystal shunt capacity and at that time the circuit becomes neutralized by the associated neutralizing condenser $C_{N1}$, $C_{N2}$, $C_{N3}$ and oscillation ceases. In the other direction of operation, namely, as the magnitude of the inductance of the variable inductance device L10, L11 or L12, etc., is decreased in inductance value, the associated crystal body X1, X2 or X3, etc., operates at a frequency at which it is in effect a larger and larger inductance since the external associated circuit then presents in effect a smaller and smaller capacity. However, this capacity can never be less than the effective crystal capacity to ground 2 at the bridge junction 18 and accordingly when that condition is reached, any further decreases in the inductance of L10, L11, L12, etc., produce essentially no further change in the oscillator frequency.

Figure 4:
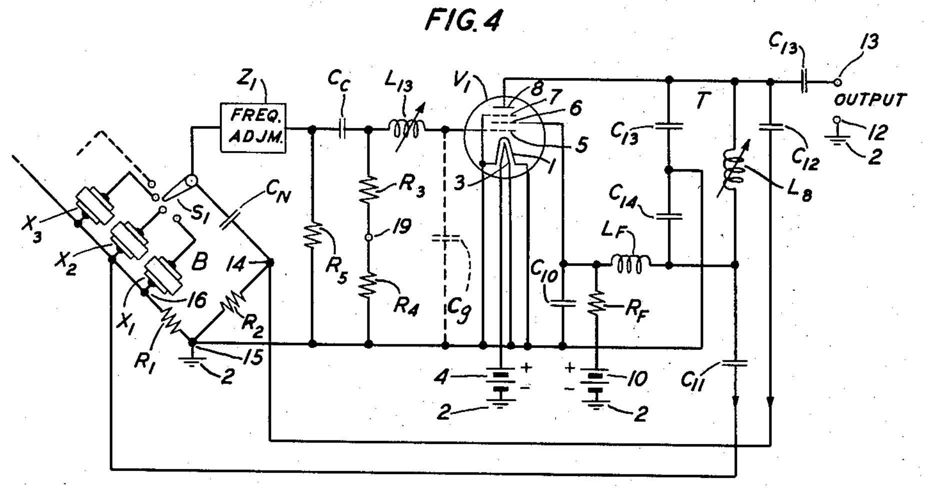
Fig. 4 is a circuit diagram illustrating a modification of the harmonic crystal oscillator circuit shown in Fig. 3.

Fig. 4 is a circuit diagram illustrating a modification of the harmonic mode crystal oscillator circuit shown in Fig. 3, and providing among other points of difference, a simplified form for the bridge system B over that shown in Fig. 3, a simplified form of crystal switching arrangement S1 for the harmonic mode crystals X1, X2, X3, etc., and feedback path phase shifting means comprising bridge coupling capacitors C11 and C12, in place of the inductance coupling L9 shown in Fig. 3, for phase shift purposes and other purposes such as preventing oscillations at the fundamental mode frequencies of the crystal bodies X1, X2 or X3, etc.

As illustrated in Fig. 4, the harmonic crystal oscillator circuit may comprise a bridge or network B connected in circuit relation with the plate or anode electrode 8, the input or control grid electrode 5 and the grounded cathode electrode 1 of the pentode type oscillator tube V1. The several series resonant harmonic mode series-resonant type piezoelectric crystal bodies X1, X2, X3, etc., may each be selectively and separately disposed in one arm of the bridge B in the feedback circuit extending between the control grid and plate electrodes 5 and 8 respectively of the oscillator tube V1, by means of a single pole multiple contact position switch S1. The neutralizing capacitor $C_N$ may be disposed in another arm of the bridge B and may, as hereinbefore described, be utilized, when needed, in order to neutralize or balance out the shunt capacity across the crystal units X1, X2 or X3, etc., and thereby prevent the circuit from oscillating at frequencies other than the desired series-resonant harmonic mode frequency of the crystal body X1, X2 or X3, etc. The resistors R1 and R2 may be tapped therebetween at 15 and connected with the grounded cathode electrode 1 of the vacuum tube V1, as hereinbefore described in connection with Fig. 3.

The resistors R1 and R2 are resistors across which may be developed the grid-driving and neutralizing voltages for the bridge circuit B, and for this purpose may be connected in circuit with the phase shifting, bridge coupling capacitors C11 and C12 which in turn may be connected with the opposite ends of the plate circuit tuned tank circuit T comprising the series-connected plate circuit tuning capacitors C13 and C14 shunted by the variable plate circuit tuning inductance winding L8.

Figure 4A:
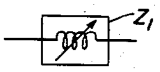
Figs. 4A and 4B are diagrams illustrating alternative forms that may be utilized for the impedance Z1.
Figure 4B:
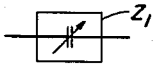

As illustrated in Fig. 4, the input grid circuit 5 for the vacuum tube V1 may include therein, connected in series circuit relation, a variable grid circuit tuning inductance winding L13, a grid circuit direct-current blocking and radio frequency current coupling capacitor $C_c$, and a frequency-adjusting impedance device Z1 which may comprise either an inductance device as illustrated in Fig. 4A or a capacitance device as illustrated in Fig. 4B, depending upon the particular mechanical layout of the system utilized, as hereinafter described more fully.

The circuit, as shown in Fig. 4, may also include an impedance limiting resistor R5, a pair of series-connected grid leak and grid current measuring resistors R3 and R4 respectively, a common screen and plate circuit filter resistor $R_F$, a radio frequency choke coil $L_F$ disposed in the circuit supplying positive potential to the plate electrode 8 of the vacuum tube V1 from the power supply source 10, and a common screen and plate circuit by-pass capacitor C10. The effective input-to-ground 2 capacity for the vacuum tube V1 may be represented by the capacitance $C_g$, as shown in dotted lines in Fig. 4. This capacity $C_g$ cooperates with the input circuit tuning inductor L13 in order to provide a substantially 90-degree phase shift in the oscillator feedback path, as described more fully hereinafter.

In operation, the tuned plate circuit L8, C13, C14 for the oscillator tube V1 may be tuned to resonance at the mean frequency of the several harmonic mode crystal bodies X1, X2 and X3, etc., that may be utilized to provide a plurality of harmonic mode crystal frequencies having a desired spread in crystal frequencies, as of about ±.25 per cent for example. Where the maximum spread in crystal frequency is of the order of that value, the plate circuit impedance of the oscillator tube V1 will be predominately resistive in character. The bridge resistors R1 and R2 may be chosen in value to be substantially lower than the reactance of any stray circuit capacity disposed across them, and the capacitors C11 and C12 may be chosen to have a substantially higher value of reactance than the resistances of R1 and R2 respectively. The voltages applied at points 14 and 16 across the series-connected resistors R1 and R2 will then be essentially 180 degrees out of phase with respect to each other, and also essentially at a 90-degree phase shift relation with respect to the voltage across the tuned plate circuit T. Accordingly, the phase shift capacitors C11 and C12 provide a substantially 90-degree phase shift in that part of the oscillator feedback path disposed between the output of the oscillator tube V1 and the input to the bridge B. Such use of capacitors C11 and C12 in conjunction with the resistors R1 and R2 also acts to suppress fundamental mode oscillation.

The bridge arm neutralizing capacitor $C_N$ may be chosen in capacitance value to balance the bridge circuit B against the shunt capacity of each of the crystal bodies X1, X2 and X3, etc., and its associated holder. Energy is then passed through the crystal selector switch S1 and the impedance Z1 at the series-resonant frequency of the particular harmonic mode crystal body X1, X2 or X3, etc., as selected by the switch S1, since the bridge circuit B is unbalanced at this series-resonant frequency only. The voltage appearing across the impedance limiting resistor R5 is stepped up at the grid electrode 5 of the vacuum tube V1, by the resonant circuit comprising the inductor L13 disposed in the grid circuit and the associated grid 5-to-ground 2 capacity $C_g$, and results in an additional feedback path 90 degrees phase shift of the voltage at the grid 5 of the tube V1, thus giving the necessary 180 degrees total feedback path phase shift required for oscillation.

The value of the impedance limiting resistor R5 may be chosen to be substantially lower than the reactance of any stray circuit capacity across it, and thus may serve to limit the impedance presented to the crystal body X1, X2 or X3, etc., by the detuning of the L13, $C_g$ circuit that would otherwise produce a frequency change in the circuit, in the manner of the frequency changing circuit at L10, L11, L12 described in connection with Fig. 3. The tuned L13, $C_g$ circuit in Fig. 4 may be normally tuned for resonance at the mean frequency of the several harmonic mode crystal bodies X1, X2 and X3, etc., utilized in the circuit of Fig. 4, as indicated by the maximum oscillator grid current measured at 19.

The impedance Z1 of Fig. 4 may be either an inductive or capacitive reactance device as illustrated in Figs. 4A and 4B respectively, and as shown in Fig. 4 may be connected in series circuit relation with the bridge B in order to adjust the frequency of oscillation in this circuit of Fig. 4 to correspond, for any particular crystal body X1, X2 or X3, etc., to that of a standard frequency crystal test set (not shown) utilizing the same crystal body, for frequency correlation purposes. The impedance Z1 accordingly depends on the particular mechanical layout of this circuit compared to the associated test set arrangement, and may be chosen so that, when the L13, $C_g$ circuit of Fig. 4 is tuned for maximum oscillator grid current therein as measured at 19, the above-mentioned frequency correlation is obtained. It will be noted that the impedance Z1 of Fig. 4 acts in the manner of the frequency adjusting series-resonant grid circuit employed in the oscillator shown in Fig. 3.

Figure 5:
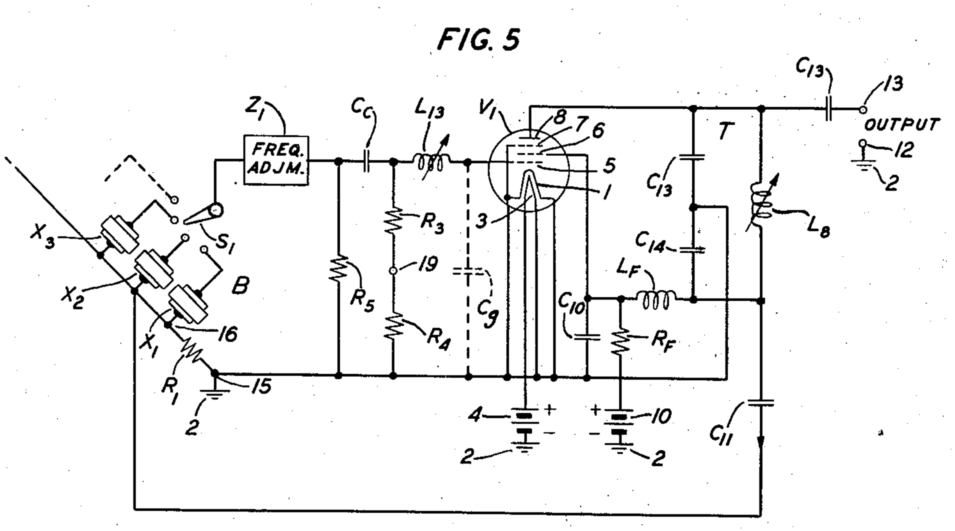
Fig. 5 is a circuit diagram illustrating a modification of the harmonic crystal oscillator circuit shown in Fig. 4, and which may be utilized when crystal bodies having comparatively low harmonic mode frequencies are employed.

It will be understood that the values of the component elements utilized in the circuit of Fig. 4, may be chosen to suit the characteristics of the particular crystal bodies X1, X2 and X3, etc., utilized therein. For example, when utilizing harmonic mode crystal bodies X1, X2 and X3, etc., operating at the relatively lower ranges in frequencies, as from about 10 to 70 megacycles per second for example, the crystal series-resonant resistance may then be low compared to the value of the crystal shunt capacitive reactance so that, when operated between the relatively low impedance resistors R1 and R5, energy passed through the crystal shunt capacity may then not be sufficient to sustain circuit oscillation while energy passed through the relatively lower crystal series-resonant resistance will sustain oscillation. The capacitors $C_N$ and C12 and the resistor R2 of Fig. 4 may then be omitted from the circuit as illustrated in Fig. 5. However, the latter circuit components $C_N$, C12 and R2 would be used and included as illustrated in Fig. 4 at some higher frequency where the crystal shunt capacitive reactance is lower as compared to the crystal series-resonant resistance.

Accordingly, the crystal bodies X1, X2 and X3, etc., may, in the circuits illustrated in Figs. 4 and 5 be operated between low impedances as provided by resistors R1 and R5 at the lower values of crystal frequencies with the possibility of eliminating the neutralizing components $C_N$, C12, R2 as illustrated in Fig. 5; or with the possibility of using such neutralizing components $C_N$, C12 and R2 where needed, as at the higher values of crystal frequencies as illustrated in Fig. 4.

It will be noted that the circuits shown in Figs. 4 or 5 may employ a single pentode tube V1 with a resultant saving in power supply current, that impedance means Z1 may be provided in the grid circuit 5 for adjusting the circuit frequency, and that the increased gain in the feedback path to the grid electrode 5 as provided by the step-up in gain from the L13, $C_g$ circuit, permits otherwise marginally active crystals X1, X2 and X3, etc. to oscillate at good strength. The strength of crystal oscillation may be a matter of importance where it is desired, as in many cases, to generate an electrical harmonic or overtone of the crystal harmonic mode oscillation frequency in the oscillator tube V1 itself, and take off this higher frequency electrical harmonic frequency energy for utilization, as by means of an electrical harmonic tuned circuit disposed in series with the plate electrode 8 of the oscillator V1 and tuned to the desired electrical harmonic frequency referred to, in the manner illustrated in Fig. 1C. In general, the greater the strength of crystal oscillation, the greater will be the magnitude of oscillator grid drive and electrical harmonic ouput produced in the oscillator tube V1.

Also, it will be noted that in the circuit illustrated in Figs. 4 or 5, means for obtaining a substantially 90-degree phase shift in the feedback path plate circuit coupling to the bridge or network B are provided, in combination with the tuned grid circuit of the grounded cathode tube V1, and that the single tube (V1) circuit incorporates means for operating the crystal body X1, X2 or X3, etc., between low values of impedances R1 and R5.

Although this invention has been described and illustrated in relation to specific arrangements, it is to be understood that it is capable of application in other organizations and is therefore not to be limited to the particular embodiments disclosed.

What is claimed is:

1. Harmonic crystal oscillator apparatus comprising an electronic gain device having oscillation generator electrodes comprising anode, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said anode and grid electrodes thereof, a circuit including another and capacitive arm in said bridge disposed adjacent said first-mentioned bridge arm, connected at its ends in circuit between said anode and grid electrodes of said gain device and constituting means for neutralizing or balancing out the shunt capacitance disposed across said harmonic mode crystal body, a tuned tank circuit reactance means connected in shunt relation across said two adjacent arms of said bridge, disposed in said feedback path and tuned substantially to said mechanical harmonic mode series-resonant frequency of said crystal body, and discriminator reactance means disposed in circuit relation with respect to said feedback path for transmitting oscillations through said gain device at said desired harmonic mode series-resonant frequency of said crystal body while simultaneously blocking or attenuating oscillations at the undesired fundamental mode frequency thereof.

2. Harmonic crystal oscillator apparatus comprising an electronic gain device having oscillation generator electrodes comprising anode, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said anode and grid electrodes thereof, a circuit including a capacitive arm in said bridge disposed adjacent said first-mentioned bridge arm, connected at its ends in circuit between said anode and grid electrodes of said gain device and constituting means for neutralizing or balancing out the shunt capacitance disposed across said harmonic mode crystal body, a tuned tank circuit reactance means connected in shunt relation across said two adjacent arms of said bridge, disposed in said feedback path and tuned substantially to said mechanical harmonic mode series-resonant frequency of said crystal body, and discriminator reactance means disposed in circuit relation with respect to said feedback path for transmitting oscillations through said gain device at said desired harmonic mode series-resonant frequency of said crystal body while simultaneously blocking or attenuating oscillations at the undesired fundamental mode frequency thereof, said discriminator reactance means comprising an inductance device.

3. Harmonic crystal oscillator apparatus comprising an electronic gain device having oscillation generator electrodes comprising anode, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said anode and grid electrodes thereof, a circuit including another or capacitive arm in said bridge disposed adjacent said first mentioned bridge arm, connected at its ends in circuit between said anode and grid electrodes of said gain device and constituting means for neutralizing or balancing out the shunt capacitance across said harmonic mode crystal body, a tuned tank circuit reactance means connected in shunt relation across said two adjacent arms of said bridge, disposed in said feedback path and tuned substantially to said mechanical harmonic mode series-resonant frequency of said crystal body, and discriminator reactance means disposed in circuit relation with respect to said feedback path for transmitting oscillations through said gain device at said desired harmonic mode frequency of said crystal body while simultaneously blocking or attenuating oscillations at the undesired fundamental mode frequency thereof, said discriminator reactance means comprising an inductance device connected in shunt relation with respect to said grid and grounded cathode electrodes of said gain device and having an inductance value sufficient for parallel-resonating the circuit capacity disposed across said grid and grounded cathode electrodes at a frequency value of such a relation to said desired harmonic mode frequency to thereby constitute said discriminator reactance means.

4. Harmonic crystal oscillator apparatus comprising an electronic gain device having oscillation generator electrodes comprising anode, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said anode and grid electrodes thereof, a circuit including a capacitive arm in said bridge disposed adjacent said first-mentioned bridge arm, connected at its ends in circuit between said anode and grid electrodes of said gain device and constituting means for neutralizing or balancing out the shunt capacitance disposed across said harmonic mode crystal body, a tuned tank circuit reactance means connected in shunt relation across said two adjacent arms of said bridge, disposed in said feedback path and tuned substantially to said mechanical harmonic mode series-resonant frequency of said crystal body, and discriminator reactance means disposed in circuit relation with respect to said feedback path for transmitting oscillations through said gain device at said desired harmonic mode frequency of said crystal body while simultaneously blocking or attenuating oscillations at the undesired fundamental mode frequency thereof, said discriminator reactance means comprising an inductance device connected in shunt relation with respect to said grid and grounded cathode electrodes of said gain device and having an inductance value sufficient for parallel-resonating the circuit capacity disposed across said grid and grounded cathode electrodes at a frequency value of such a relation to said desired harmonic mode frequency to thereby constitute said discriminator reactance means, and a grid leak resistor paralleled by a by-pass condenser and connected in series circuit relation between said discriminator inductance device and said grounded cathode electrode of said gain device.

5. Harmonic crystal oscillator apparatus comprising an electronic gain device having oscillation generator electrodes comprising anode, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said anode and grid electrodes thereof, a circuit including another and capacitive arm in said bridge disposed adjacent said first-mentioned bridge arm, connected at its ends in circuit between the anode circuit and grid electrode of said gain device and constituting means for neutralizing or balancing out the shunt capacitance disposed across said harmonic mode crystal body, a tuned tank circuit reactance means connected in shunt relation across said two adjacent arms of said bridge by means of a transformer, disposed in said feedback path and tuned substantially to said mechanical harmonic mode series-resonant frequency of said crystal body, said tank circuit reactance means being so disposed in circuit relation with respect to said feedback path as to constitute a discriminator reactance means for transmitting oscillations through said gain device at said desired harmonic mode frequency of said crystal body while simultaneously blocking or attenuating oscillations at the undesired fundamental mode frequency thereof, said discriminator reactance means comprising an inductance.

6. Harmonic crystal oscillator apparatus comprising an electronic gain device having oscillation generator electrodes comprising anode, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said anode and grid electrodes thereof, a circuit including another arm in said bridge disposed adjacent said first-mentioned bridge arm, connected at its ends in circuit between said anode and grid electrodes of said gain device and constituting means for neutralizing or balancing out the shunt capacitance across said harmonic mode crystal body, a tuned tank circuit reactance means connected in shunt relation across said two adjacent arms of said bridge, disposed in said feedback path and tuned substantially to said mechanical harmonic mode series-resonant frequency of said crystal body, and discriminator reactance means disposed in circuit relation with respect to said feedback path for transmitting oscillations through said gain device at said desired harmonic mode frequency of said crystal body while simultaneously blocking or attenuating oscillations at the undesired fundamental mode frequency thereof, said discriminator reactance means comprising capacitance means disposed in said feedback path in the part thereof extending between said bridge and said anode electrode circuit of said gain device.

7. Harmonic crystal oscillator apparatus comprising an electronic gain device having oscillation generator electrodes comprising plate, control grid and grounded cathode electrodes, a network system connected in circuit relation with said last-mentioned electrodes, a plurality of mechanical harmonic mode series-resonant frequency piezoelectric crystal bodies having different harmonic mode series-resonant frequencies spaced at intervals extending over a range or band of frequencies and adapted to be disposed in an arm of said network system in the feedback path of said gain device extending between said plate and grid electrodes thereof, means comprising switching apparatus disposed in said feedback path for in effect individually and selectively switching each of said crystal bodies in and out of circuit relation with respect to said feedback path, a capacitative arm in said network system disposed adjacent said first-mentioned arm thereof and constituting means for neutralizing or balancing out the shunt capacitance disposed across said respective harmonic mode crystal bodies, a tuned tank circuit reactance means connected in shunt relation across said two adjacent network arms and tuned substantially to the mean frequency of the said mechanical harmonic mode frequencies of said crystal bodies, and discriminator reactance means disposed in circuit relation with respect to said feedback path for transmitting oscillations through said gain device at said desired harmonic mode frequency of each of said crystal bodies while simultaneously blocking oscillations at the undesired fundamental mode frequency of each of said crystal bodies.

8. Harmonic crystal oscillator apparatus comprising an electronic gain device having anode, control grid and grounded cathode electrodes, a bridge connected in circuit relation with said last-mentioned electrodes, a harmonic mode series-resonant frequency type piezoelectric crystal body disposed in one arm of said bridge in the feedback path of said gain device extending between said anode and control grid electrodes thereof, capacitors disposed respectively in two other adjacent arms of said bridge and having a tap connection therebetween connected with said grounded cathode electrode of said gain device, a tank circuit disposed in that part of said feedback path extending between said crystal body and said anode electrode of said gain device, tuned substantially to said harmonic mode series-resonant frequency of said crystal body and comprising an inductance winding disposed in shunt relation across said capacitors disposed in said last-mentioned two adjacent bridge arms, means comprising an inductance device connected in shunt relation with respect to said grid and grounded cathode electrodes of said gain device for suppressing oscillations at the undesired fundamental mode frequency of said crystal body while simultaneously transmitting oscillations through said gain device at said desired harmonic mode frequency thereof.

9. Harmonic crystal oscillator apparatus comprising a single pentode type electronic gain device having oscillation generator electrodes comprising plate, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said plate and control grid electrodes thereof, a neutralizing capacitor disposed in another arm of said bridge, connected at its ends in circuit between said plate and control grid electrodes of said gain device and having a capacitance value sufficient to constitute means for neutralizing or balancing out the shunt capacitance across said harmonic mode crystal body, reactance devices disposed respectively in two other adjacent arms of said bridge and having a tap connection therebetween connected with said grounded cathode electrode of said gain device, a tuned tank circuit reactance device connected in shunt relation across said last-mentioned bridge arms and reactance devices, disposed in said feedback path extending between said plate and control grid electrodes of said gain device and tuned substantially to said mechanical harmonic mode series-resonant frequency of said crystal body, discriminator inductance means connected in shunt relation with respect to said bridge and with respect to said control grid and grounded cathode electrodes of said gain device, said inductance means having an inductance value sufficient for parallel-resonating the circuit capacity disposed across said control grid and grounded cathode electrodes at a frequency value of such a relation to said desired harmonic mode frequency to thereby constitute means for preventing said crystal body from oscillating at its undesired fundamental mode frequency while simultaneously permitting oscillations therein at said desired harmonic mode frequency thereof.

10. Harmonic crystal oscillator apparatus comprising a single pentode type electronic gain device having oscillation generator electrodes comprising plate, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said plate and control grid electrodes thereof, a neutralizing capacitor disposed in another arm of said bridge, connected at its ends in circuit between said plate and control grid electrodes of said gain device and having a capacitance value sufficient to constitute means for neutralizing or balancing out the shunt capacitance across said harmonic mode crystal body, reactance devices disposed respectively in two other adjacent arms of said bridge and having a tap connection therebetween connected with said grounded cathode electrode of said gain device, a tuned tank circuit reactance device connected in shunt relation across said two last-mentioned bridge arms and reactance devices, disposed in said feedback path extending between said plate and control grid electrodes of said gain device and tuned substantially to said mechanical harmonic mode series-resonant frequency of said crystal body, discriminator inductance means connected in shunt relation with respect to said bridge and with respect to said control grid and grounded cathode electrodes of said gain device, said inductance means having an inductance value sufficient for parallel-resonating the circuit capacity disposed across said control grid and grounded cathode electrodes at a frequency value of such a relation to said desired harmonic mode frequency to thereby constitute means for preventing said crystal body from oscillating at its undesired fundamental mode frequency while simultaneously permitting oscillations therein at said desired harmonic mode frequency thereof, and an output circuit for selecting electrical harmonics of the said desired crystal harmonic mode frequency oscillations comprising in the part of said feedback path extending between said bridge and said plate electrode of said gain device, a tuned inductance and capacitance system.

11. Harmonic crystal oscillator apparatus comprising a single pentode type electronic gain device having oscillation generator electrodes comprising plate, control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said plate and grid electrodes thereof, a neutralizing capacitor disposed in another arm of said bridge, connected at its ends in circuit between said plate and grid electrodes of said gain device and having a capacitance value sufficient to constitute means for neutralizing or balancing out the shunt capacitance across said harmonic mode crystal body, capacitors disposed respectively in two other adjacent arms of said bridge and having a tap connection therebetween connected with said grounded cathode electrode of said gain device, a tuned tank circuit inductance device connected in shunt relation across said two last-mentioned bridge arms and capacitors, disposed in said feedback path extending between said plate and control grid electrodes of said gain device and tuned substantially to said mechanical harmonic mode series-resonant frequency of said crystal body, discriminator inductance means connected in shunt relation with respect to said bridge and also said control grid and grounded cathode electrodes of said gain device, said inductance means having an inductance value sufficient for parallel-resonating the circuit capacity disposed across said control grid and grounded cathode electrodes of said gain device at a frequency value of such a relation to said desired harmonic mode frequency to thereby constitute means for preventing said crystal body from oscillating at its undesired fundamental mode frequency while simultaneously permitting oscillations therein at said desired harmonic mode frequency thereof, and an output circuit for selecting electrical harmonics of the said desired crystal harmonic mode frequency oscillations comprising in the part of said feedback path extending between said bridge and said plate electrode of said gain device a tuned inductance and capacitance system.

12. Harmonic crystal oscillator apparatus comprising a single pentode type electronic gain device having oscillation generator electrodes comprising plate, control grid and grounded cathode electrodes, a bridge connected in circuit relation with said last-mentioned electrodes, a plurality of mechanical harmonic mode series-resonant frequency type piezoelectric crystal bodies having different harmonic mode series-resonant frequencies spaced at intervals extending over a range or band of frequencies and adapted to be individually disposed in one arm of said bridge in the feedback path of said gain device extending between said plate and control grid electrodes thereof, means comprising a plurality of switching devices for in effect individually and selectively switching each of said harmonic mode crystal bodies in and out of circuit relation with respect to said feedback path, a neutralizing capacitor disposed in another arm of said bridge, connected at its ends in circuit between said plate and control grid electrodes of said gain device and having a capacitance value sufficient to constitute means for neutralizing or balancing out the shunt capacitance across each of said harmonic mode crystal bodies, capacitors disposed respectively in two other adjacent arms of said bridge and having a tap connection therebetween connected with said grounded cathode electrode of said gain device, a tuned tank circuit inductance device connected in shunt relation across said two last-mentioned bridge arms and capacitors, disposed in said feedback path extending between said plate and grid electrodes of said gain device and tuned substantially to the mean frequency of the said mechanical harmonic mode series-resonant frequencies of said crystal bodies, discriminator inductance means connected in shunt relation across said bridge and across said control grid and grounded cathode electrodes of said gain device, said inductance means having an inductance value sufficient for parallel-resonating the circuit capacity disposed across said grid and grounded cathode electrodes of said gain device at a frequency value of such a relation to each of said desired harmonic mode frequencies of said crystal bodies to thereby constitute means for preventing each of said crystal bodies from oscillating at its undesired fundamental mode frequency while permitting oscillations therein at its desired mechanical harmonic mode frequency, and an output circuit for selecting electrical harmonics of said desired harmonic mode frequency oscillations of said crystal bodies comprising a tuned inductance and capacitance system connected with the part of said feedback path extending between said bridge and said plate electrode of said gain device.

13. Harmonic crystal oscillator apparatus comprising a single pentode type electronic gain device having oscillation generator electrodes comprising plate, control grid and grounded cathode electrodes, a bridge connected in circuit relation with said last-mentioned electrodes, a plurality of mechanical harmonic mode series-resonant frequency type piezoelectric crystal bodies having different harmonic mode series-resonant frequencies spaced at intervals extending over a range or band of frequencies and adapted to be individually disposed in one arm of said bridge in the feedback path of said gain device extending between said plate and control grid electrodes thereof, means comprising a plurality of switching devices for in effect individually and selectively switching each of said harmonic mode crystal bodies in and out of circuit relation with respect to said feedback path, a neutralizing capacitor disposed in another arm of said bridge, connected at its ends in circuit between said plate and control grid electrodes of said gain device and having a capacitance value sufficient to constitute means for neutralizing or balancing out the shunt capacitance across each of said harmonic mode crystal bodies, capacitors disposed respectively in two other adjacent arms of said bridge and having a tap connection therebetween connected with said grounded cathode electrode of said gain device, a tuned tank circuit inductance device connected in shunt relation across said two last-mentioned bridge arms and capacitors, disposed in said feedback path extending between said plate and grid electrodes of said gain device and tuned substantially to the mean of the said mechanical harmonic mode series-resonant frequencies of said crystal bodies, discriminator inductance means connected in shunt relation across said bridge and across said control grid and grounded cathode electrodes of said gain device, said inductance means having an inductance value sufficient for parallel-resonating the circuit capacity disposed across said grid and grounded cathode electrodes of said gain device at a frequency value of such relation to each of said desired harmonic mode frequencies of said crystal bodies to thereby constitute means for preventing each of said crystal bodies from oscillating at its undesired fundamental mode frequency while permitting oscillations therein at its desired mechanical harmonic mode frequency, and an output circuit for selecting electrical harmonics of said desired harmonic mode frequency oscillations of said crystal bodies comprising a tuned inductance and capacitance system connected with the part of said feedback path extending between said bridge and said plate electrode of said gain device, said switching devices comprising rectifiers individually disposed in series circuit relation with said respective harmonic mode crystal bodies.

14. Harmonic crystal oscillator apparatus comprising an electronic device having plate, control grid and grounded cathode electrodes, a bridge connected in circuit relation with said last-mentioned electrodes, a harmonic mode series-resonant frequency type piezoelectric crystal body disposed in one arm of said bridge, resistors disposed in two other adjacent arms of said bridge and having a tap connection therebetween connected with said grounded cathode electrode of said gain device, means comprising a tuned circuit inductance element disposed in said grid electrode circuit in series circuit relation with said harmonic mode crystal body for varying or shifting said oscillator frequency, said tuned circuit inductance element in combination with the oscillator circuit capacitance as disposed in shunt relation across said grid and grounded cathode electrodes of said gain device constituting means for producing a substantially 90 degrees phase shift in said grid electrode circuit, and means for producing an additional substantially 90 degrees phase shift at the input terminals of said bridge comprising a relatively high leakage inductance means coupling said resistors in said bridge arms to said plate output circuit of said gain device, said pair of substantially 90 degrees phase shift means constituting means for producing a substantially 180 degrees phase shift in the feedback path of said gain device extending between said plate output and grid electrodes thereof.

15. Harmonic crystal oscillator apparatus comprising a single electronic gain device having plate, control grid and grounded cathode electrodes, a network connected in circuit relation with said last-mentioned electrodes, a harmonic mode series-resonant type piezoelectric crystal body disposed in one arm of said network in the feedback path of said gain device extending from said plate to said grid electrodes thereof, a resistor disposed in another arm of said network in circuit between one end of said crystal body and said grounded cathode electrode of said gain device, an impedance limiting resistor disposed across said network in circuit between the other end of said crystal body and said grounded cathode electrode of said gain device, said crystal body being operatively disposed between said network arm resistor and said impedance limiting resistor and said last-mentioned resistors having low values of impedance relative to circuit capacitive reactances shunting them, means for obtaining a substantially 90 degrees phase shift in said grid electrode circuit comprising a tuned circuit, said tuned circuit comprising an inductance element disposed in series relation in said grid electrode circuit between said grid electrode and the grid end of said impedance limiting resistor and said tuned circuit also comprising the capacitance of said oscillator circuit as measured between said grid and grounded cathode electrodes of said gain device, and means for obtaining an additional substantially 90 degrees phase shift in said plate electrode circuit coupling said plate electrode to said network comprising capacitance means disposed in series circuit relation in said plate electrode and network coupling circuit.

16. Harmonic crystal oscillator apparatus comprising a single pentode type electronic gain device having oscillation generator electrodes comprising output or plate, input or control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said plate and grid electrodes thereof, a neutralizing capacitor disposed in another arm of said bridge, connected at its opposite ends in circuit between said plate and grid electrodes of said gain device and having a capacitance value sufficient to constitute means for neutralizing or balancing out the shunt capacitance across said harmonic mode crystal body, impedance devices disposed respectively in two other adjacent arms of said bridge and having a tap connection therebetween connected with said grounded cathode electrode of said gain device, a tuned tank circuit reactance device operatively connected in shunt relation across said two last-mentioned bridge arms, disposed in said feedback path extending between said plate and grid electrodes of said gain device and tuned substantially to said mechanical harmonic mode series-resonant frequency of said crystal body, means comprising a discriminator reactance circuit connected in circuit relation with said feedback path and across said bridge for attenuating oscillations at the undesired fundamental mode frequency of said crystal body while simultaneously permitting oscillations therein at said desired harmonic mode frequency thereof and a plate circuit output for said desired harmonic mode frequency oscillations.

17. Harmonic crystal oscillator apparatus comprising a single pentode type electronic gain device having oscillation generator electrodes comprising output or plate, input or control grid and grounded cathode electrodes, a bridge connected in circuit relation with said last-mentioned electrodes, a mechanical harmonic mode series-resonant frequency type piezoelectric crystal body disposed in one arm of said bridge in the feedback path of said gain device extending between said plate and grid electrodes thereof, a neutralizing capacitor disposed in another arm of said bridge, connected at its opposite ends in circuit between said plate and grid electrodes of said gain device and having a capacitance value sufficient to constitute means for neutralizing or balancing out the shunt capacitance across said harmonic mode crystal body, impedance devices disposed respectively in two other adjacent arms of said bridge and having a tap connection therebetween connected with said grounded cathode electrode of said gain device, a tuned tank circuit reactance device operatively connected in shunt relation across said two last-mentioned bridge arms, disposed in said feedback path extending between said plate and grid electrodes of said gain device and tuned substantially to said mechanical harmonic mode series-resonant frequency of said crystal body, means comprising a discriminator reactance circuit connected in shunt relation across said bridge for attenuating oscillations at the undesired fundamental mode frequency of said crystal body while simultaneously permitting oscillations therein at said desired harmonic mode frequency thereof, a plate circuit output for said desired harmonic mode frequency oscillations, and means comprising a reactance device connected in series circuit relation in that part of said feedback path between said bridge and said input grid electrode of said gain device for adjusting the frequency of said desired harmonic mode frequency oscillations.

BURTON H. SIMONS.

REFERENCES CITED

The following references are of record in the file of this patent:

UNITED STATES PATENTS

| Number | Name | Date |
|---|---|---|
| 2,260,707 | Fair | Oct. 28, 1941 |